United States Patent [19]

Bauer et al.

[11] 3,956,675
[45] May 11, 1976

[54] ELECTRICAL CONTROL HOUSING AND SUPPORT PACKAGE

[75] Inventors: Frederick T. Bauer; Anthony C. Cairo, both of Holland, Mich.

[73] Assignee: Robertshaw Controls Company, Richmond, Va.

[22] Filed: Oct. 15, 1974

[21] Appl. No.: 514,441

[52] U.S. Cl. .......................... 317/120; 317/101 R; 317/100; 220/3.94; 174/52 R
[51] Int. Cl.² ............................................ H05K 5/04
[58] Field of Search ............... 317/99, 100, 101 R, 317/101 C, 101 B, 112, 117, 118, 120; 220/3.8, 3.9, 3.92, 3.94, DIG. 25; 206/45.14, 305, 328, 329, 334, 806; 312/223, 351; 248/24, 350, 358 R; 174/50, 50.54, 52 R; 200/293, 301, 302, 314, 317

[56] References Cited
UNITED STATES PATENTS

| 2,887,525 | 5/1959 | Lewis | 220/3.94 |
| 2,924,639 | 2/1960 | Zelt | 174/50 |
| 3,052,821 | 9/1962 | Scoville | 317/101 R |
| 3,084,211 | 4/1963 | Rapata | 248/24 |
| 3,218,519 | 11/1965 | Casey | 317/120 |
| 3,309,485 | 3/1967 | Gluck | 200/317 |
| 3,479,568 | 11/1969 | Shapiro | 317/120 |
| 3,524,137 | 8/1970 | Redfield | 317/101 R |
| 3,737,729 | 6/1973 | Carney | 317/120 |
| 3,852,643 | 12/1974 | Seki | 317/100 |

Primary Examiner—Gerald P. Tolin
Attorney, Agent, or Firm—Malcolm R. McKinnon

[57] ABSTRACT

An electrical control housing and support package including a mounting base, a support member floatingly mounted on said base and a cover secured to said base, said package having improved heat sink, heat transfer and heat dissipation qualities, providing improved environmental protection and support for the components of electrical control systems, and also being susceptible of manufacture and assembly with automated techniques.

2 Claims, 10 Drawing Figures

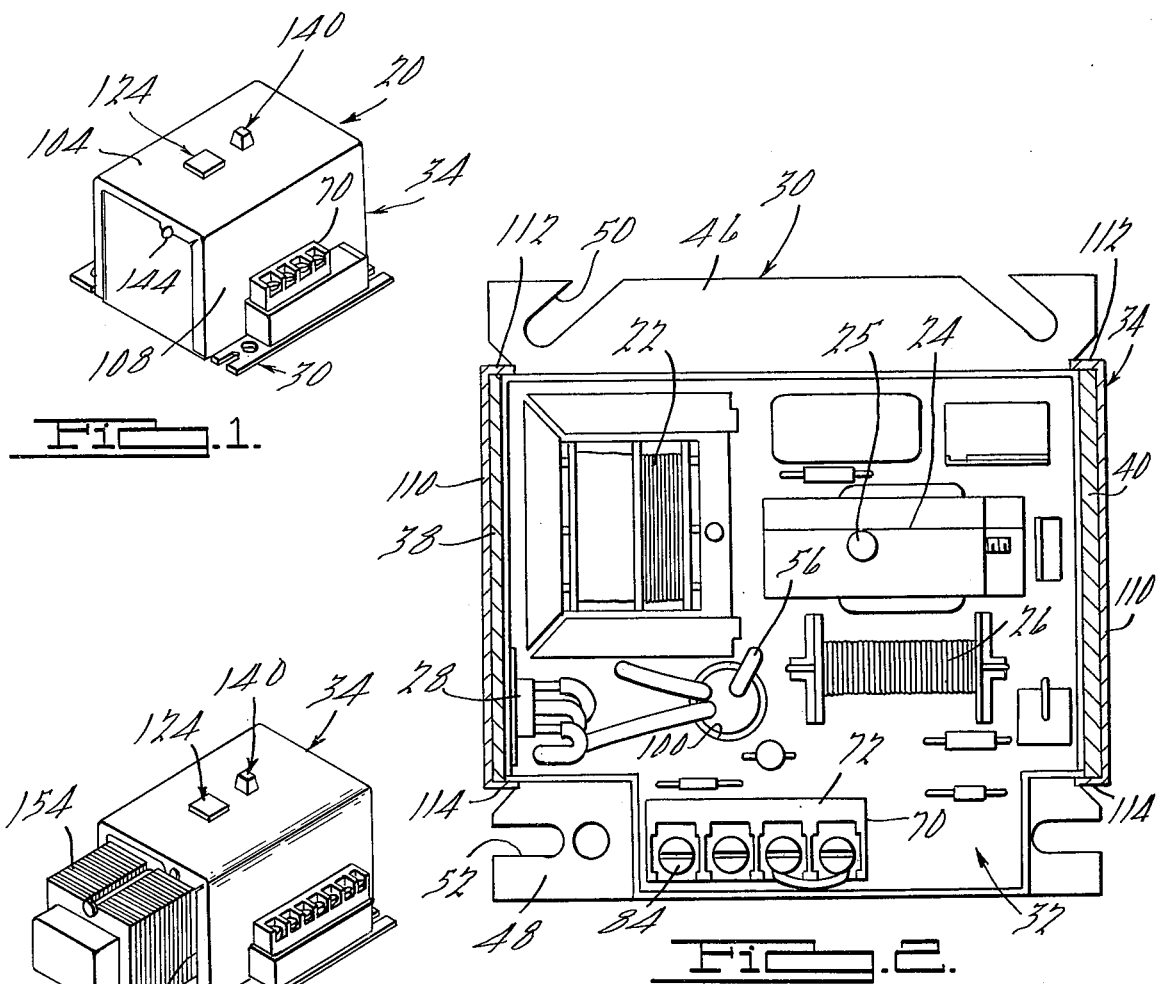
FIG. 1.
FIG. 2.
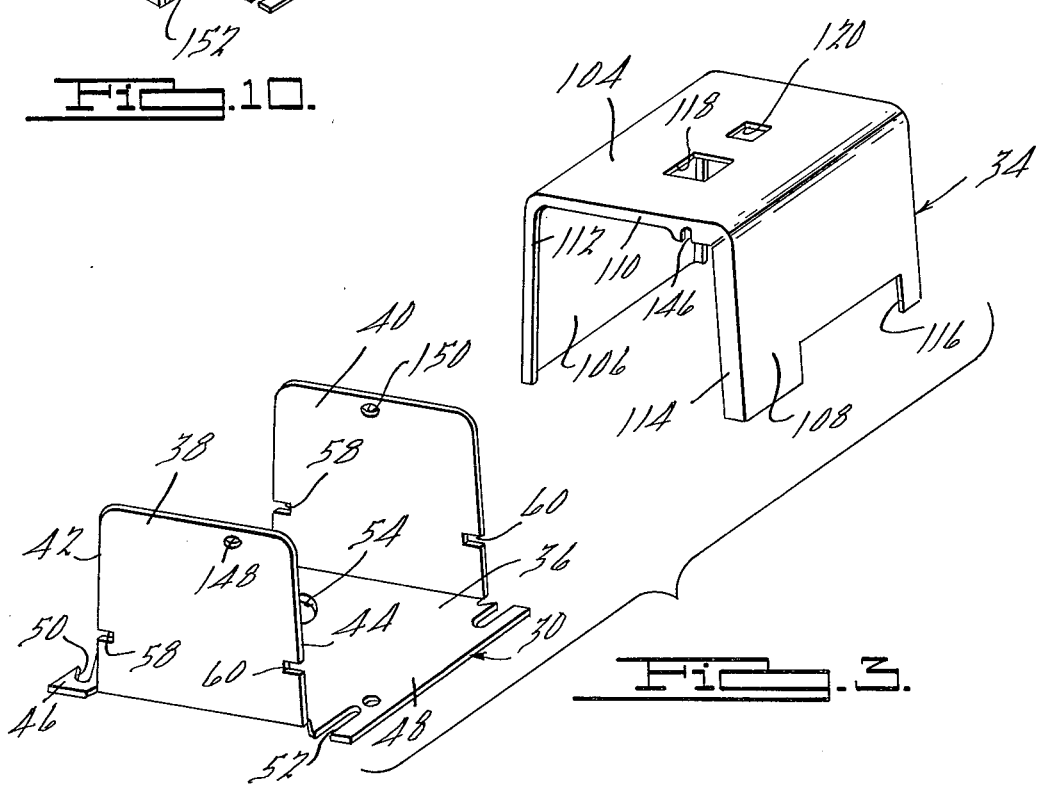
FIG. 10.
FIG. 3.

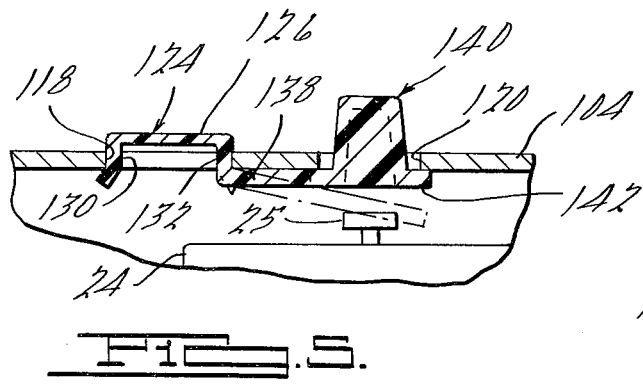
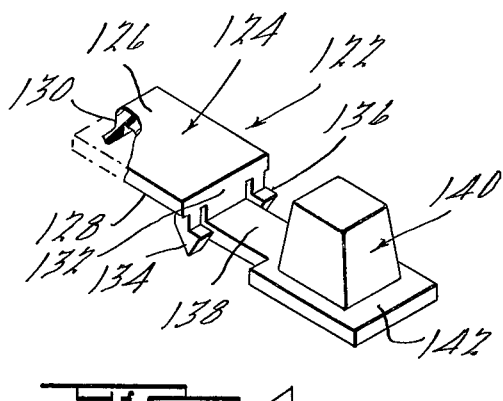
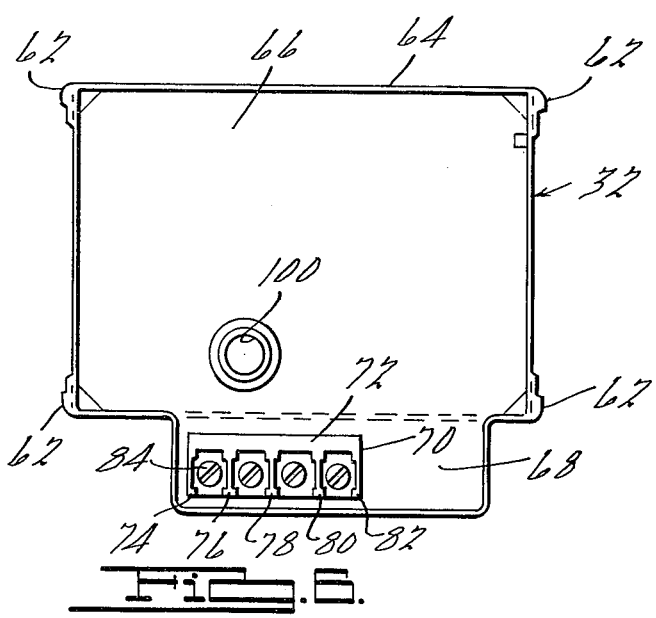
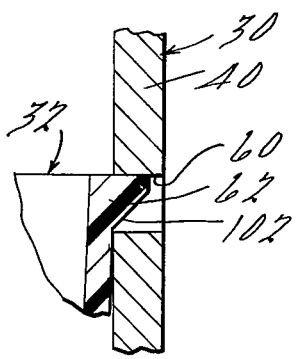
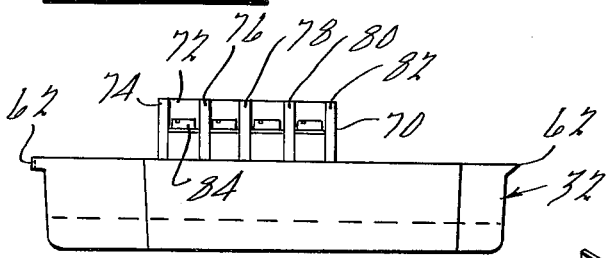
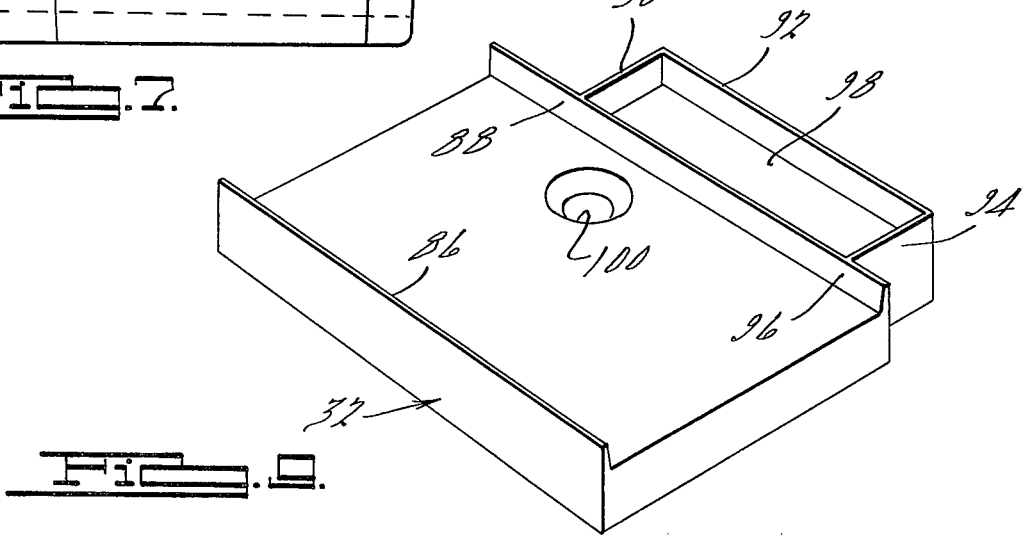

ELECTRICAL CONTROL HOUSING AND SUPPORT PACKAGE

BRIEF SUMMARY OF THE INVENTION

This invention relates to electrical controls and, more particularly, to an improved housing and support package for electrical control systems such as electrical control systems for: furnaces, ignition devices, air conditioners, hydronic equipment, oil fired water heaters, construction heaters, power gas ignition apparatus and other electrically controlled equipment.

As is well known in the art, electrical control systems of the indicated character embody electrical circuitry and components which must be supported and housed, usually on or adjacent to the equipment being controlled thereby. As is also well known in the art, such electrical control systems generate heat which must be dissipated to prevent damage to the circuitry and other components embodied in the control systems, and the circuitry and other components embodied in the control systems must also be protected against mechanical shock and/or jarring hazards as well as from dust, dirt, moisture and other foreign matter which might be present in the ambient atmosphere and which might damage the systems. Heretofore, a wide variety of packaging techniques have been employed to house and support electrical control systems of the indicated character. However, prior packaging techniques have been subject to deficiencies in that they often have relatively limited heat sink, heat transfer and heat dissipation capabilities, are not mechanically shock resistant, are not conducive to automated manufacturing and assembly techniques, are difficult to modify to meet individual customer requirements, require excessive assembly and installation labor and do not lend themselves to dense wiring configurations.

An object of the present invention is to overcome the aforementioned as well as other deficiencies in prior housing and support means for electrical control systems of the indicated character and to provide an improved electrical control housing and support package which has increased heat sink, heat transfer and heat dissipation qualities and which is economically and commercially feasible to manufacture and assemble with automated techniques, strong and rugged in construction, mechanically shock resistant, durable, efficient, susceptible of dense wiring configurations and reliable in service.

Another object of the invention is to provide an improved electrical control housing and support package incorporating improved means for providing strain relief for lead wires and improved protection for fragile circuitry against dust, dirt, moisture and other foreign matter.

Another object of the invention is to provide an improved electrical control housing and support package which reduces assembly line time and labor and simplifies the production and installation of electrical control systems.

Another object of the invention is to provide an improved housing and support package that may be readily adapted to house and support a wide variety of electrical control systems.

The above as well as other objects and advantages of the present invention will become apparent from the following description, the appended claims and the accompanying drawings.

BRIEF DESCRIPTION OF THE DRAWINGS

FIG. 1 is a perspective view of an electrical control housing and support package embodying the present invention;

FIG. 2 is a sectional plan view of the electrical control housing and support package illustrated in FIG. 1;

FIG. 3 is a perspective, exploded view of the cover and base of the structure illustrated in FIG. 1;

FIG. 4 is an enlarged, perspective view of the reset button and lockout signal member embodied in the structure illustrated in FIG. 1;

FIG. 5 is a longitudinal sectional view of the structure illustrated in FIG. 4, showing the same installed in the cover of the structure illustrated in FIG. 1;

FIG. 6 is a top plan view of the support member embodied in the structure illustrated in FIG. 1, showing the same with the electrical components of the control system removed for purposes of clarity of description;

FIG. 7 is a front elevational view of the structure illustrated in FIG. 6;

FIG. 8 is an enlarged, fragmentary, sectional view of a portion of the structure illustrated in FIG. 6, showing the same as installed in the structure illustrated in FIG. 1;

FIG. 9 is a bottom perspective view of the structure illustrated in FIG. 6; and

FIG. 10 is a perspective view of another embodiment of the invention, illustrating the manner in which the structure illustrated in FIG. 1 may be modified to house and support a different electrical control system.

DETAILED DESCRIPTION

Referring to the drawings, a preferred embodiment of the invention is illustrated in FIGS. 1 through 9 thereof and is comprised of an electrical control housing and support package, generally designated 20, which may be utilized to house and support a wide variety of electrical control systems such as electrical control systems for: furnaces, ignition devices, air conditioners, hydronic equipment, oil fired water heaters, construction heaters, power gas ignition apparatus and other electrically controlled equipment. By way of example, the package 20 may be utilized to house and support a primary control system for furnaces of the type disclosed in the co-pending application of Frederick T. Bauer, Ser. No. 421,557, filed Dec. 4, 1973, entitled Electrical Primary Control System for Furnaces, now U.S. Pat. No. 3,892,981 issued July 1, 1975 and assigned to the assignee of the present invention. Such a system includes, inter alia, a step-down transformer 22, a line voltage safety switch 24 having a reset plunger 25, a reed switch 26, a triac 28 and various resistors, capacitors and other electrical components which are described in detail in the aforementioned co-pending application and need not be described herein in greater detail.

The electrical control housing and support package 20 includes a base, generally designated 30, a support, generally designated 32, and a cover, generally designated 34, all of which will be described hereinafter in greater detail.

As shown in FIGS. 1, 2 and 3, the base 30 is of generally U-shaped configuration and includes, as viewed in FIG. 3, a substantially flat, horizontally extending bottom wall 36 and integral end walls 38 and 40 projecting upwardly from the opposite ends of the bottom wall 36, the edge portions 42 and 44 of each of the end walls 38 and 40 being formed on a slight taper so as to provide a draft angle facilitating assembly with the cover 34. The marginal edge portions 46 and 48 of the bottom wall 36 project laterally outwardly beyond the edges 42 and 44, respectively, of the end walls 38 and 40, and the marginal edge portions 46 and 48 are provided with elongate open ended slots, such as 50 and 52, adapted to receive mounting screws (not shown) for securing the package 20 on or adjacent to the equipment being controlled by the electrical control system housed and supported by the package 20. The base 30 is preferably formed in one piece from aluminum, which has relatively high heat conducting properties, although it will be understood that the base 30 may be formed of steel or other suitable material having sufficient strength and physical properties fit and sufficient for the purpose intended. The base 30 may also be provided with an opening, such as 54, at any desired location, adapted to accommodate lead wires, such as 56, leading to the controlled equipment (not shown). As shown in FIGS. 3 and 8, each of the end walls 38 and 40 is provided with open ended notches 58 and 60 adapted to receive tapered mounting lugs 62 provided on the support 32, as will be described hereinafter in greater detail.

The support 32 is preferably formed of thermoplastic carbonate-linked polymers produced by reacting bisphenol A and phosgene and sold under the Trademark "Lexan" or similar plastic material having electrical insulating properties. In the manufacture of the control system, the electrical circuitry of the control system is preferably embodied on a conventional circuit board and the various electrical components, resistors, capacitors and other desired components are mounted on the circuit board after which the circuit board is embedded in the support 32 by molding and curing the "Lexan" or other plastic material in the configuration illustrated in FIGS. 6, 7, 8 and 9. As shown in the drawings, the support 32 includes a main body portion 64 which is of generally rectangular prismatic configuration and in which the electrical system's circuit board is embedded, the various electrical components of the control system projecting upwardly above the upper surface 66 of the main body portion 64. In the preferred embodiment of the invention illustrated, the support 32 also includes an integral laterally projecting portion 68 on which a terminal block 70 is mounted, the terminal block 70 including an upstanding back wall 72 and spaced laterally projecting partition walls 74, 76, 78, 80 and 82 between which terminal screws, such as 84 are disposed. With such a construction, the terminal block acts to guide lead wires under the heads of the terminal screws, thereby simplifying the making of a termination during assembly. Such lead wires may, for example, lead to a thermostat.

As shown in FIG. 9, the underside of the main body portion 64 and the laterally projecting portion 68 are provided with depending flanges 86, 88, 90, 92 and 94 to define wiring cavities or channels 96 and 98 which allow the lead wires to be brought through an opening 100 and out of the package 20 anywhere that a customer's wiring requirements may dictate.

The main body portion 64 of the support 32, which, as previously mentioned, is of generally rectangular prismatic configuration, is also provided with the integral tapered mounting lugs 62 at the upper four corners thereof, the mounting lugs 62 having a downwardly and inwardly tapered cam surface 102 as shown in FIG. 8. With such a construction, in the assembly of the package 20, the support 32 is floatingly mounted on the base 30 by snapping the mounting lugs 62 into the associated notches 58 and 60 provided in the end walls 38 and 40 of the base, the tapered surface 102 on each of the mounting lugs acting as a cam as the support is introduced into the base 32 between the end walls 38 and 40 thereof. Such a construction not only provides a floating support for the electrical circuitry and associated electrical components carried by the support 32, but also provides strain relief for lead wires, a moisture barrier and increased strength for the fragile electrical circuits embodied on the circuit board embedded in the support 32.

As is well known in the art, triacs generate considerable heat in operation and, in the preferred embodiment of the invention illustrated, the triac 28 is mounted on the end wall 38 of the base 30 rather than on the support 32. With such a construction, the triac is relatively isolated from the other components of the electrical control system which are carried by the support 32, and at the same time, heat generated by the triac is dissipated by heat transfer through and from the support 30 and cover 34 which, when assembled, provide a massive heat sink and also provide a block body radiator for heat transfer.

The cover 34 is preferably formed of one piece of aluminum, anodized black for heat radiating purposes, although it will be understood that the cover 34 may also be formed of steel or other suitable material having sufficient strength and physical properties fit and sufficient for the purposes intended. As shown in FIGS. 1 and 3, the cover 34 includes a substantially flat, horizontally extending top wall 104 and integral depending side walls 106 and 108 extending downwardly at a slight angle from the opposite sides of the top wall 104, the angle of inclination of the side walls 106 and 108 being complementary to the angle of inclination of the edges 42 and 44, respectively, of the end walls 38 and 40 of the base 30. As shown in FIGS. 1, 2 and 3, inwardly projecting flanges 110, 112 and 114 are formed integrally with the top and side walls of the cover 34 at each end thereof, the flanges 110, 112 and 114 being adapted to overlie and engage the end walls 38 and 40 of the base 30 when the cover 34 is assembled on the base as illustrated in FIGS. 1 and 2. It will be understood that the side wall 108 defines a generally rectangular open bottom opening 116 adapted to accommodate the laterally projecting portion 68 of the support 32.

The top wall 104 of the cover 34 defines a pair of spaced rectangular openings 118 and 120 adapted to receive a unitary reset button and lock out signal member, generally designated 122, which is preferably formed in one piece from relatively resilient, flexible, translucent plastic of any desired color. As shown in FIGS. 1, 4 and 5, the member 122 includes a combined locator and lens portion 124 which is of generally open bottom box shaped configuration and includes a top wall 126, depending side walls such as 128 and depending end walls 130 and 132. The combined locator and lens portion 124 is adapted to be inserted into the opening 118 in the top wall 104 of the cover 34 from the underside thereof, the end walls 130 and 132 of the portion 124 being provided with integral outwardly projecting lugs such as 134 and 136 which limit the movement of the portion 124 into the opening 118. Since the member 122 is formed of translucent material, the portion 124 may also function as a lens for a warning light embodied in the control system and disposed at any desired location on the support 32 below the top wall of the cover. The member 122 also includes an integral lever portion 138 which projects laterally from the end wall 132 and which is adapted to underlie the inner surface of the top wall 104 of the housing when the button member 122 is assembled therein. The member 122 also includes a button portion 140 which is of generally truncated pyramidal configuration and which is adapted to project from an enlarged section 142 of the lever portion through the opening 120 in the top wall of the cover 34. The enlarged section 142 of the lever portion 138, in turn, is disposed above the reset plunger 25 of the safety switch 24 so that the safety switch may be reset by manually pushing the button portion 140 downwardly to apply force to the plunger 25 as illustrated in the dashed lines in FIG. 5.

In the assembly of the package 20, the member 122 is inserted in the cover, the support 32 is floatingly mounted on the base 30, and the triac 28 fixed to the end wall 38 of the base 30 all in the manner previously described. The cover 34 is then mounted on the base 30 and secured thereto as by screws 144 which pass through slots such as 146 provided in the flanges 110 of the cover and threadably engage internally threaded openings such as 148 and 150 provided in the end walls 38 and 40 of the base 30.

FIG. 10 illustrates the manner in which the electrical control housing and support package 20 may be easily modified to accommodate a wide variety of control systems. In the embodiment of the invention illustrated in FIG. 10, a rectangular opening 152 is formed in the end wall 38 of the support 30, the opening 152 being adapted to accommodate an enlarged transformer 154 which may be mounted on the support 32 so as to project outwardly through the opening 154 in the end wall 38 and into the ambient atmosphere, thereby increasing the ability of the package to dissipate heat generated by the transformer 154. It will be appreciated that the base 30 and cover 34 continue to provide a massive heat sink and also provide a block body radiator for heat generated by the transformer 154 as well as the other components of any control system carried by the support 32 as previously described.

While a preferred embodiment of the invention has been illustrated and described, it will be understood that various changes and modifications may be made without departing from the spirit of the invention.

What is claimed is:

1. In an electrical control housing and support package, the combination including a mounting base having a bottom wall and spaced, integral end walls, said end walls each defining a pair of spaced notches, a support member of generally rectangular prismatic configuration, an electrical control circuit carried by and embedded in said support member, means floatingly mounting said support member on said base including a plurality of integral tapered mounting lugs disposed at the opposite ends of said support member, said mounting lugs projecting into the notches defined by said end walls, and a cover overlying said support member and secured to said base.

2. The combination as set forth in claim 1, said cover including a top wall and integral depending side walls, a unitary reset signal member formed of resilient, flexible, translucent material and having a locator portion, an integral lever portion projecting longitudinally from said locator portion, and an integral button portion projecting laterally from said lever portion, said top wall of said cover defining a pair of spaced openings, said locator portion being disposed in one of the openings defined by said top wall of said cover and said button portion projecting through the other of the openings defined by said top wall of said cover.

* * * * *